(12) United States Patent
Chen et al.

(10) Patent No.: US 12,189,425 B2
(45) Date of Patent: Jan. 7, 2025

(54) DISPLAY BACKPLANE AND FABRICATION METHOD THEREFOR, DISPLAY PANEL AND DISPLAY DEVICE

(71) Applicant: BOE Technology Group Co., Ltd., Beijing (CN)

(72) Inventors: Dengyun Chen, Beijing (CN); Hao Liu, Beijing (CN); Huijuan Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/034,399

(22) PCT Filed: Dec. 23, 2020

(86) PCT No.: PCT/CN2020/138649
§ 371 (c)(1),
(2) Date: Apr. 28, 2023

(87) PCT Pub. No.: WO2022/133810
PCT Pub. Date: Jun. 30, 2022

(65) Prior Publication Data
US 2024/0019899 A1  Jan. 18, 2024

(51) Int. Cl.
*G06F 1/16* (2006.01)
*G06F 1/18* (2006.01)
*G06V 40/13* (2022.01)

(52) U.S. Cl.
CPC ............ *G06F 1/1643* (2013.01); *G06F 1/188* (2013.01); *G06V 40/1318* (2022.01)

(58) Field of Classification Search
CPC ........ G06F 1/1643; G06F 1/188; G06F 3/044; G06F 18/00; G06V 40/1318; H10K 59/873
See application file for complete search history.

(56) References Cited

U.S. PATENT DOCUMENTS

2017/0286740 A1* 10/2017 Liu .................... G06V 40/1306
2017/0338245 A1* 11/2017 Park .................... H01L 27/1255
(Continued)

FOREIGN PATENT DOCUMENTS

| CN | 106249961 A | 12/2016 |
| CN | 107480609 A | 12/2017 |

(Continued)

OTHER PUBLICATIONS

International Search Report for PCT/CN2020/138649 Mailed Sep. 24, 2021.

*Primary Examiner* — Towfiq Elahi
(74) *Attorney, Agent, or Firm* — Ling Wu; Stephen Yang; Ling and Yang Intellectual Property

(57) ABSTRACT

Provided in the present application are a display backplane and a fabrication method therefor, a display panel and a display device. The display backplane is divided into a display region and a non-display region which is arranged surrounding the display region, the non-display region comprising a fingerprint recognition region. The display backplane comprises: a base substrate; a thin film transistor array layer provided at one side of the base substrate; a capacitive electrode layer, which comprises a first electrode layer and a second electrode layer; a light-emitting element which is provided at the side of the thin film transistor array layer away from the base substrate; and a fingerprint recognition sensor, which is located in the fingerprint recognition region. Moreover, a drive electrode and a sensing electrode are respectively arranged on the same layer as the first electrode layer and the second electrode layer in the capacitive electrode layer.

20 Claims, 4 Drawing Sheets

(56) References Cited

U.S. PATENT DOCUMENTS

| | | |
|---|---|---|
| 2018/0130857 A1 | 5/2018 | Lee et al. |
| 2018/0151838 A1 | 5/2018 | Park et al. |
| 2018/0232075 A1* | 8/2018 | Yang .................... G02F 1/1333 |
| 2019/0034695 A1 | 1/2019 | Zhang et al. |
| 2019/0212840 A1 | 7/2019 | Zhang et al. |
| 2019/0250764 A1 | 8/2019 | Kim et al. |
| 2019/0332842 A1* | 10/2019 | Zhou .................. G06V 40/1318 |

FOREIGN PATENT DOCUMENTS

| | | |
|---|---|---|
| CN | 107749419 A | 3/2018 |
| CN | 107819018 A | 3/2018 |
| CN | 108123062 A | 6/2018 |
| CN | 108733260 A | 11/2018 |
| CN | 109388287 A | 2/2019 |
| CN | 110162205 A | 8/2019 |
| CN | 111524952 A | 8/2020 |

* cited by examiner

DISPLAY BACKPLANE AND FABRICATION METHOD THEREFOR, DISPLAY PANEL AND DISPLAY DEVICE

CROSS-REFERENCE TO RELATED APPLICATION

The present application is a U.S. National Phase Entry of International Application No. PCT/CN2020/138649 having an international filing date of Dec. 23, 2020. The entire contents of the above-identified application are hereby incorporated by reference.

TECHNICAL FIELD

The present application relates to the field of display technologies, in particular to a display backplane and a fabrication method therefor, a display panel, and a display apparatus.

BACKGROUND

At present, with popularization of full-screen display apparatuses, optical fingerprint identification under a display panel requires digging a hole in the display panel, and a metal trace needs to be rearranged under the display panel, so that more light can be captured by a fingerprint identification sensor. A structure of a display apparatus for fingerprint identification is complex, and the fingerprint identification sensor is easily affected by stray light adversely, resulting in poor accuracy of fingerprint identification.

Therefore, an existing display apparatus capable of achieving fingerprint identification still needs to be improved.

SUMMARY

The present application aims at solving one of technical problems in the related art at least to some extent. Therefore, an object of the present application is to provide a display backplane which is simple in structure, easy to achieve, capable of achieving fingerprint identification, there is no need to add an additional process act or rearrange a metal trace when fabricating on a basis of achieving fingerprint identification, a fingerprint identification region will not occupy space of a display region, and it is easy to achieve a narrow bezel.

In one aspect of the present application, the present application provides a display backplane. According to an embodiment of the present application, the display backplane is divided into a display region and a non-display region disposed around the display region. The non-display region includes a fingerprint identification region. The display backplane includes: a base substrate; a thin film transistor array layer disposed on a side of the base substrate, wherein the thin film transistor array layer includes a gate, an active layer, a source, and a drain; a capacitive electrode layer including a first electrode layer and a second electrode layer, wherein the first electrode layer is disposed in a same layer as the gate, and the second electrode layer is disposed on a side of the first electrode layer away from the base substrate; a light-emitting element disposed on a side of the thin film transistor array layer away from the base substrate; and a fingerprint identification sensor located in the fingerprint identification region, wherein a drive electrode and a sensing electrode in the fingerprint identification sensor are disposed in a same layer as the first electrode layer and the second electrode layer, respectively. The display backplane has a simple structure, is easy to achieve, is capable of achieving fingerprint identification, there is no need to add an additional process act or rearrange a metal trace inside the display backplane when fabricating on a basis of achieving fingerprint identification, a fingerprint identification region will not occupy space of the display region, and it is easy to achieve a narrow bezel.

According to an embodiment of the present application, the first electrode layer is disposed in a same layer as the gate.

According to an embodiment of the present application, the second electrode layer is between the source, the drain, and the first electrode layer.

According to an embodiment of the present application, the drive electrode is disposed in a same layer as the first electrode layer, the sensing electrode is disposed in a same layer as the second electrode layer, or, the drive electrode is disposed in a same layer as the second electrode layer, and the sensing electrode is disposed in a same layer as the first electrode layer.

According to an embodiment of the present application, one of the drive electrode and the sensing electrode is arranged along a first direction, and the other of the drive electrode and the sensing electrode is arranged along a second direction intersecting with the first direction. The drive electrode and the sensing electrode have an overlapping region, and the drive electrode and the sensing electrode located in the overlapping region are configured into a plurality of sensing pixel units disposed at intervals with each other, and a capacitor may be formed in a sensing pixel unit.

According to an embodiment of the present application, the display backplane further includes a fingerprint identification chip, and the sensing electrode is electrically connected with the fingerprint identification chip.

According to an embodiment of the present application, the sensing electrode is electrically connected with the fingerprint identification chip through a metal lead.

In another aspect of the present application, the present application provides a display panel. According to an embodiment of the present application, the display panel includes the display backplane described above. The display panel has a simple structure, is easy to achieve, is capable of achieving fingerprint identification, there is no need to add an additional process act or rearrange a metal trace inside the display backplane when fabricating on a basis of achieving fingerprint identification, the fingerprint identification region will not occupy space of the display region, and it is easy achieve a narrow bezel.

According to an embodiment of the present application, the display panel further includes an encapsulation structure disposed on a surface of the light emitting element in the display backplane away from the base substrate, an orthographic projection of the encapsulation structure on the base substrate covers the display region and a portion of the non-display region, a first retaining wall is disposed on a peripheral edge of the encapsulation structure, and a second retaining wall is disposed around a peripheral edge of the non-display region, and the fingerprint identification region in the display backplane is located between the first retaining wall and the second retaining wall or between the first retaining wall and the display region.

According to an embodiment of the present application, the fingerprint identification region is located between the first retaining wall and the second retaining wall, and the orthographic projection of the encapsulation structure on the base substrate covers the fingerprint identification region.

According to an embodiment of the present application, the first retaining wall further includes at least two sub-retaining walls, and the fingerprint identification region is located between two adjacent sub-retaining walls.

In yet another aspect of the present application, the present application provides a display apparatus. According to an embodiment of the present application, the display apparatus includes the display panel described above. The display apparatus has a simple structure, is easy to achieve, is capable of achieving fingerprint identification, there is no need to add an additional process act or rearrange a metal trace inside the display backplane when fabricating on a basis of achieving fingerprint identification, the fingerprint identification region will not occupy space of the display region, and it is easy to achieve a narrow bezel.

In another aspect of the present application, the present application provides a fabrication method of the aforementioned display backplane. According to an embodiment of the present application, the method includes: forming a thin film transistor array layer, a capacitive electrode layer, a light emitting element, and a fingerprint identification sensor on a side of a base substrate, wherein the thin film transistor array layer includes a gate, an active layer, a source, and a drain, the capacitive electrode layer includes a first electrode layer and a second electrode layer, a drive electrode and a sensing electrode in the fingerprint identification sensor are respectively formed with the first electrode layer and the second electrode layer through one patterning process. The method has simple and convenient operations, and is easy to achieve, there is no need to add an additional process act or rearrange a metal trace on a basis of forming the fingerprint identification sensor, and further the display backplane described above may be effectively fabricated.

According to an embodiment of the present application, the drive electrode and the first electrode layer are formed through one patterning process, and the sensing electrode and the second electrode layer are formed through one patterning process.

According to an embodiment of the present application, the drive electrode and the second electrode layer are formed through one patterning process, and the sensing electrode and the first electrode layer are formed through one patterning process.

According to an embodiment of the present application, the method includes: forming the active layer on a side of the base substrate; forming a first gate insulation layer on a side of the active layer away from the base substrate; forming one of the drive electrode and the sensing electrode, the gate, and the first electrode layer on a side of the first gate insulation layer away from the base substrate; forming a second gate insulation layer on a side of the one of the drive electrode and the sensing electrode, the gate, and the first electrode layer away from the base substrate; forming the other of the drive electrode and the sensing electrode, and the second electrode layer on a side of the second gate insulation layer away from the base substrate; forming an interlayer dielectric layer on a side of the other of the drive electrode and the sensing electrode, and the second electrode layer away from the base substrate; forming the source and the drain; and forming the light emitting element on a side of the interlayer dielectric layer away from the base substrate to obtain the display backplane.

Figure 1:
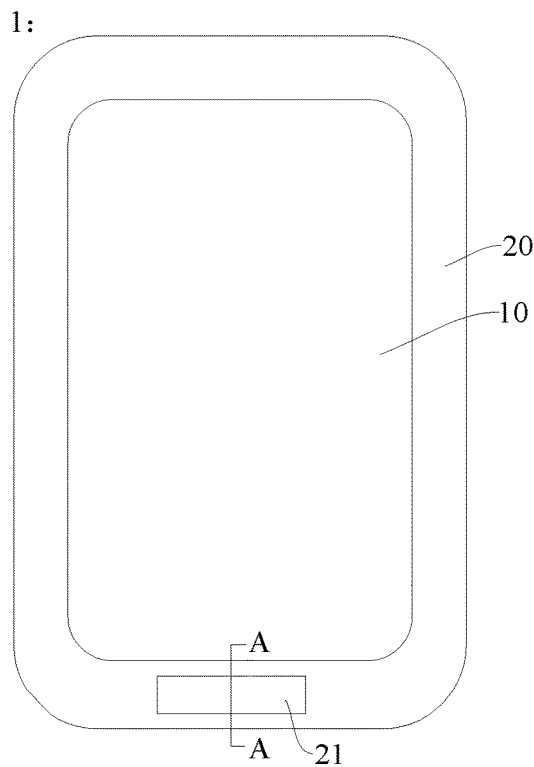
FIG. 1 shows a schematic diagram of a planar structure of a display backplane according to an embodiment of the present application.

Reference signs are described as follows.

1: display backplane 10: display region 20: non-display region 21: fingerprint identification region 100: base substrate 210: gate 220: active layer 230: source 240: drain 310: first electrode layer 320: second electrode layer 410: anode 420: emitting layer 430: cathode 510: drive electrode 520: sensing electrode 610: first gate insulation layer 620: second gate insulation layer 630: interlayer dielectric layer 640: planarization layer 650: pixel definition layer 700: encapsulation structure 710: first retaining wall 711: first sub-retaining wall 712: second sub-retaining wall 720: second retaining wall C: overlapping region.

DETAILED DESCRIPTION

Embodiments of the present application are described in detail below. The embodiments described below are exemplary and are only intended to explain the present application, but should not be construed as limitations on the present application. The embodiments in which specific technologies or conditions are not indicated shall be carried out according to technologies or conditions described in literatures in the art or according to a product specification.

Figure 2A:
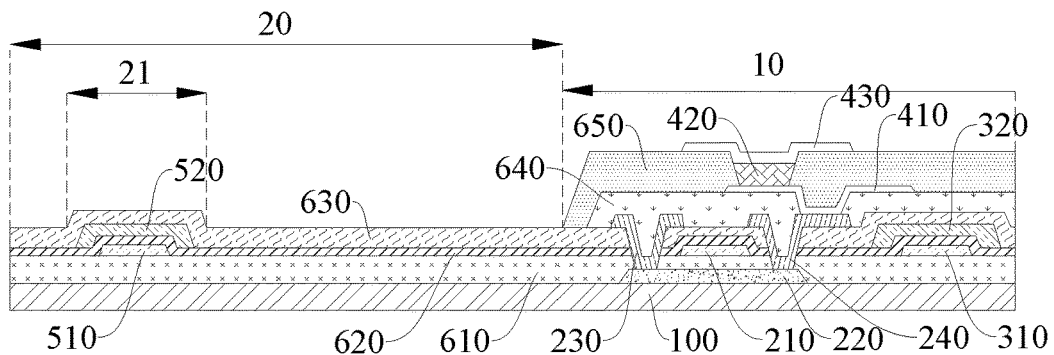
FIG. 2a shows a schematic diagram of a sectional structure of the display backplane along a line AA in the embodiment of FIG. 1.
Figure 2B:
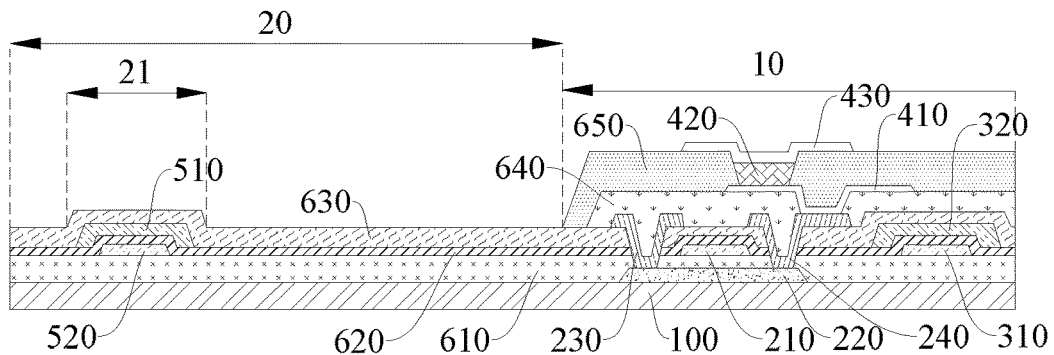
FIG. 2b shows a schematic diagram of another sectional structure of the display backplane along the line AA in the embodiment of FIG. 1.

In one aspect of the present application, the present application provides a display backplane. According to an embodiment of the present application, referring to FIG. 1, the display backplane 1 is divided into a display region 10 and a non-display region 20 disposed around the display region 10. The non-display region 20 includes a fingerprint identification region 21. Referring to FIG. 2a or FIG. 2b, the display backplane includes: a base substrate 100; a thin film transistor array layer disposed on a side of the base substrate 100, wherein the thin film transistor array layer includes a gate 210, an active layer 220, a source 230, and a drain 240; a capacitive electrode layer including a first electrode layer 310 and a second electrode layer 320, wherein the first electrode layer 310, for example, may be disposed in a same layer as the gate 210, the second electrode layer 320 is disposed on a side of the first electrode layer 310 away from the base substrate 100; and a light emitting element (not shown in the figure) disposed on a side of the thin film transistor array layer away from the base substrate 100; a fingerprint identification sensor located in the fingerprint identification region 21, wherein a drive electrode 510 and a sensing electrode 520 in the fingerprint identification sensor are disposed in a same layer as the first electrode layer 310 and the second electrode layer 320, respectively. In the display backplane, since the drive electrode 510 and the sensing electrode 520 in the fingerprint identification sensor are respectively disposed in a same layer as the first electrode layer 310 and the second electrode layer 320, a structure is simple and easy to achieve, fingerprint identification may be achieved, and on a basis of achieving fingerprint identification, there is no need to add an additional process act or rearrange a metal trace inside the display backplane when fabricating, the fingerprint identification region 21 will not occupy space of the display region 10, and a narrow bezel may be easily achieved. In addition, since the fingerprint identification sensor in the present application is integrated inside the display backplane, a thickness of the fingerprint identification sensor is lower than that of a fingerprint identification sensor attached to an outside of a display apparatus in a related technology, which conforms to a development trend of thinning the display backplane and has a good commercial prospect.

According to an embodiment of the present application, further referring to FIG. 2a and FIG. 2b, in some embodiments of the present application, a specific arrangement mode of the fingerprint identification sensor may be that the drive electrode 510 is disposed in a same layer as the first electrode layer 310, and the sensing electrode 520 is disposed in a same layer as the second electrode layer 320 (referring to FIG. 2a for a structural schematic diagram). In addition, in other embodiments of the present application, it also may be that the drive electrode 510 and the second electrode layer 320 are disposed in a same layer, and the sensing electrode 520 is disposed in a same layer as the first electrode layer 310 (referring to FIG. 2b for a structural schematic diagram), wherein it may be understood that when the drive electrode 510 and the second electrode layer 320 are disposed in a same layer, the fingerprint identification sensor may sense a fingerprint signal more sensitively and has a better effect in a process of fingerprint identification.

Figure 3:
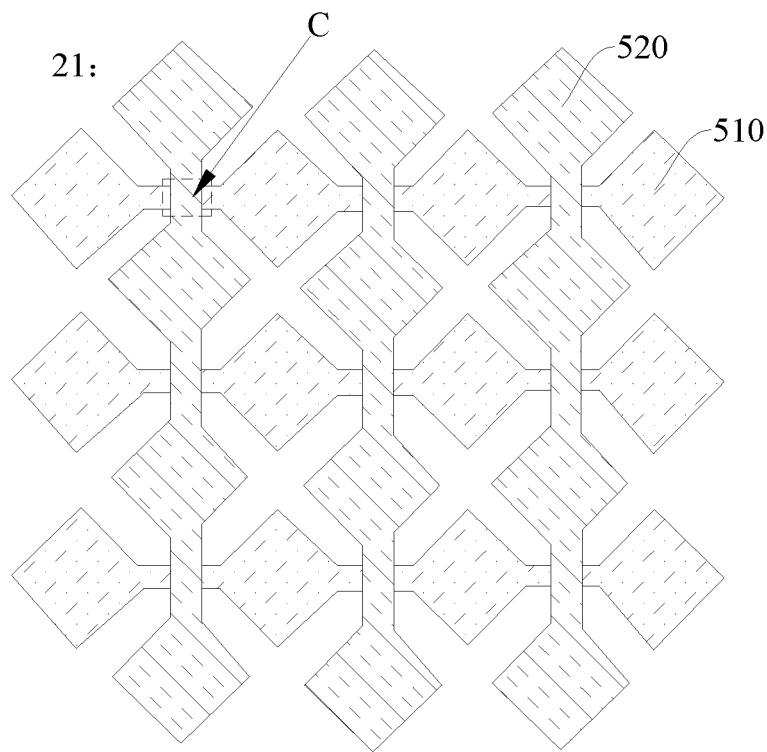
FIG. 3 shows a schematic diagram of a planar structure of a fingerprint identification sensor according to an embodiment of the present application.

According to an embodiment of the present application, further, a specific manner in which the fingerprint identification sensor performs fingerprint identification is not particularly limited. Specifically, in some embodiments of the present application, referring to FIG. 3, one of the drive electrode 510 and the sensing electrode 520 is arranged along a first direction, for example, transversely, and the other of the drive electrode 510 and the sensing electrode 520 is arranged along a second direction intersecting with the first direction, for example, longitudinally (it should be noted that the drive electrode 510 is arranged transversely and the sensing electrode 520 is arranged longitudinally in FIG. 3, but those skilled in the art may understand that it may be that the drive electrode 510 is arranged longitudinally and the sensing electrode 520 is arranged transversely, which will not be repeated herein). A first orthographic projection of the drive electrode 510 on the base substrate (not shown in the figure) and a second orthographic projection of the sensing electrode 520 on the base substrate has an overlapping region C (as shown by a dashed box in FIG. 3), that is, the drive electrode 510 and the sensing electrode 520 have an overlapping region C, and the drive electrode 510 and the sensing electrode 5200 located within the overlapping region C are configured as a plurality of sensing pixel units disposed at intervals between each other, and a capacitor may be formed in a sensing pixel unit.

According to an embodiment of the present application, specifically, when a capacitor is formed in the sensing pixel unit, a fingerprint may be regarded as another electrode plate of a sensing capacitor, and when fingerprint identification is started, the sensing capacitor formed between a skin on a surface of each sensing pixel unit and an electrode plate starts to be charged, since the fingerprint has a "ridge" and a "valley", and a pitch between the "ridge" and the electrode plate and a pitch between the "valley" and the electrode plate are different, magnitudes of generated sensing capacitors are different, and then amounts of charge stored in the capacitors will be different after a charging process. In a discharge stage of a capacitor, according to a definition of capacitance, a capacitance value at a "ridge" is large, a charge amount is high, and discharge is relatively slow; a capacitance value at a "valley" is small, a charge amount is low, and discharge is relatively fast. Furthermore, by comparing discharge rates in different sensing pixel units, it may be determined whether a skin on a sensing pixel unit is a "ridge" or a "valley", and then a fingerprint image is formed.

Figure 4:
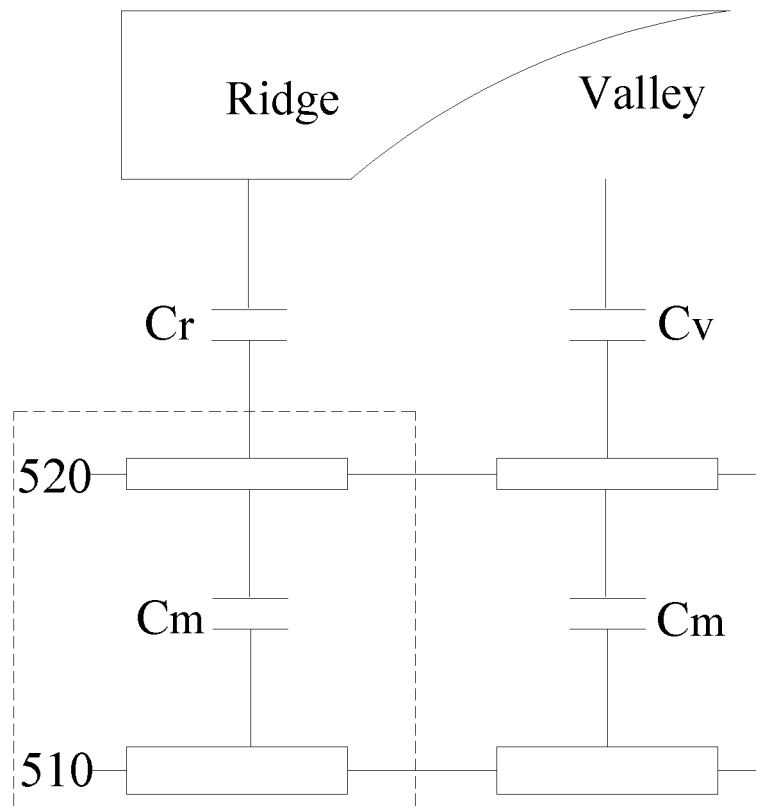
FIG. 4 shows an equivalent circuit diagram when a fingerprint identification sensor is performing fingerprint identification according to an embodiment of the present application.

More specifically, in some embodiments of the present application, referring to FIG. 4, when the fingerprint identification sensor performs fingerprint identification, the drive electrode 510 provides a drive voltage, the sensing electrode 520 is a signal output channel, and a fixed parasitic capacitance Cm is formed between the drive electrode 510 and the sensing electrode 520C. When a skin contacts the fingerprint identification sensor, a position of the skin may be regarded as a zero potential, due to a difference of sensing capacitances Cr and Cv generated by the skin in different sensing pixel units, according to a capacitance voltage division formula, potentials on the sensing electrode 520 in corresponding sensing pixel units are also different. At this time, a fingerprint identification chip (not shown in the figure) may be disposed in the display backplane described in the present application and the sensing electrode is electrically connected with the fingerprint identification chip through, for example, a metal lead, so as to detect a slight difference of potentials on sensing electrodes 520 in different sensing pixel units, and further a fingerprint image is formed.

According to an embodiment of the present application, further, a specific type of the fingerprint identification sensor described in the present application is not particularly limited, and in some embodiments of the present application, the fingerprint identification sensor may be specifically a sliding fingerprint identification sensor, which achieves identification scanning of an entire fingerprint and signal reading by sliding of a finger; of course, it may be understood that the fingerprint identification sensor described in the present application may also be other types of fingerprint identification sensors, which will not be repeated herein.

According to an embodiment of the present application, in addition, it may be understood that in the display backplane described in the present application, in addition to the previously described structure, another conventional structure in a conventional display backplane may be included, for example, referring to FIG. 2a or 2b, the display backplane may further have a first gate insulation layer 610, a second gate insulation layer 620, an interlayer dielectric layer 630, a planarization layer 640, a pixel definition layer 650, and the like, and the light emitting element may specially include an anode 410, an emitting layer 420, a cathode 430, and the like, a structure, a material, a thickness, an arrangement mode, and functions, etc. thereof are all the same as those of this film layer in a conventional display backplane, which will not be repeated herein. In some embodiments, a passivation layer may also be included and located on a side of the planarization layer 640 away from the base substrate. In some embodiments, the planarization layer 640 may be at least one layer.

In another aspect of the present application, the present application provides a fabrication method of the aforementioned display backplane. According to an embodiment of the present application, the method may include: forming a thin film transistor array layer, a capacitive electrode layer, a light emitting element, and a fingerprint identification sensor on a side of a base substrate, wherein the thin film transistor array layer includes a gate, an active layer, a source, and a drain, the capacitive electrode layer includes a first electrode layer and a second electrode layer, wherein a drive electrode and a sensing electrode in the fingerprint identification sensor are respectively formed with the first electrode layer and the second electrode layer through one patterning process. The method has simple and convenient operations, and is easy to achieve, there is no need to add an additional process act or rearrange a metal trace on a basis of forming the fingerprint identification sensor, so that the display backplane described above may be effectively fabricated.

According to an embodiment of the present application, further, as described above, in some embodiments of the present application, the drive electrode may be formed with the first electrode layer through one patterning process, and the sensing electrode may be formed with the second electrode layer through one patterning process, so that the drive electrode is disposed in a same layer as the first electrode layer, and the sensing electrode is disposed in a same layer as the second electrode layer. In addition, in other embodiments of the present application, the drive electrode may be formed with the second electrode layer through one patterning process, and the sensing electrode may be formed with the first electrode layer through one patterning process, so that the drive electrode is disposed in a same layer as the second electrode layer, and the sensing electrode is disposed in a same layer as the first electrode layer.

Figure 5:
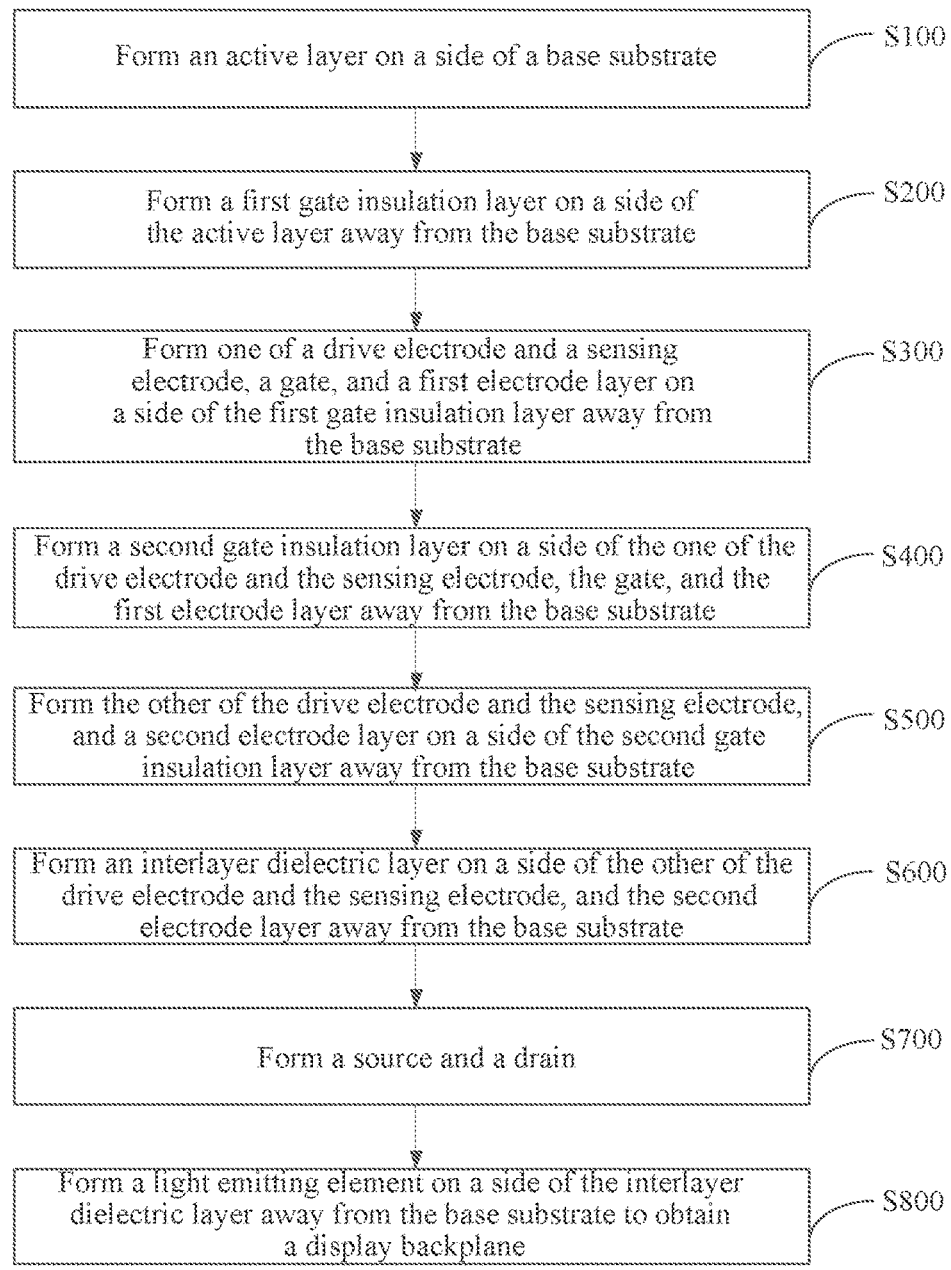
FIG. 5 shows a schematic diagram of a flow of a method for fabricating a display backplane according to an embodiment of the present application.

According to an embodiment of the present application, specifically, referring to FIG. 5, the method may specifically include following acts.

S100: forming the active layer on a side of the base substrate.

S200: forming a first gate insulation layer on a side of the active layer away from the base substrate.

S300: forming one of the drive electrode and the sensing electrode, the gate, and the first electrode layer on a side of the first gate insulation layer away from the base substrate.

S400: forming a second gate insulation layer a side of the one of the drive electrode and the sensing electrode, the gate, and the first electrode layer away from the base substrate.

S500: forming the other of the drive electrode and the sensing electrode, and the second electrode layer on a side of the second gate insulation layer away from the base substrate.

S600: forming an interlayer dielectric layer on a side of the other of the drive electrode and the sensing electrode, and the second electrode layer away from the base substrate.

S700: forming the source and the drain.

S800: forming the light emitting element on a side of the interlayer dielectric layer away from the base substrate to obtain the display backplane.

According to an embodiment of the present application, specifically, in the acts of forming the active layer, the first gate insulation layer, one of the drive electrode and the sensing electrode, the gate, the first electrode layer, the second gate insulation layer, the other one of the drive electrode and the sensing electrode, the second electrode layer, the interlayer dielectric layer, the source, the drain, the light emitting element, and the like, a specific process condition and a parameter of each act may be those of conventional formation of this layer, which will not be repeated herein. Therefore, a fabrication process is simple, convenient, easy to achieve, and easy for industrial production.

According to an embodiment of the present application, it should be noted that, in addition to the above-mentioned acts, those skilled in the art may understand that the method may further include another conventional act for forming a display backplane, which will not be repeated here.

According to an embodiment of the present application, since the first electrode layer in the capacitive electrode layer and one of the drive electrode and the sensing electrode in the fingerprint identification sensor may be formed only through one patterning process and the second electrode layer in the capacitive electrode layer and the other of the drive electrode and the sensing electrode in the fingerprint identification sensor may also be formed only through one patterning process, this method is simple, convenient, and easy to achieve, there is no need to add an additional process act on a basis of forming the fingerprint identification sensor, and simultaneously a mask required for forming the drive electrode and the sensing electrode separately is saved, and a cost is relatively low.

In another aspect of the present application, the present application provides a display panel. According to an embodiment of the present application, the display panel includes the display backplane described above. The display panel has a simple structure, is easy to achieve, capable of achieving fingerprint identification, a fingerprint identification region will not occupy space of a display region, it is easy to achieve a narrow bezel, and the display panel has all features and advantages of the display backplane described above, which will not be repeated herein.

Figure 6:
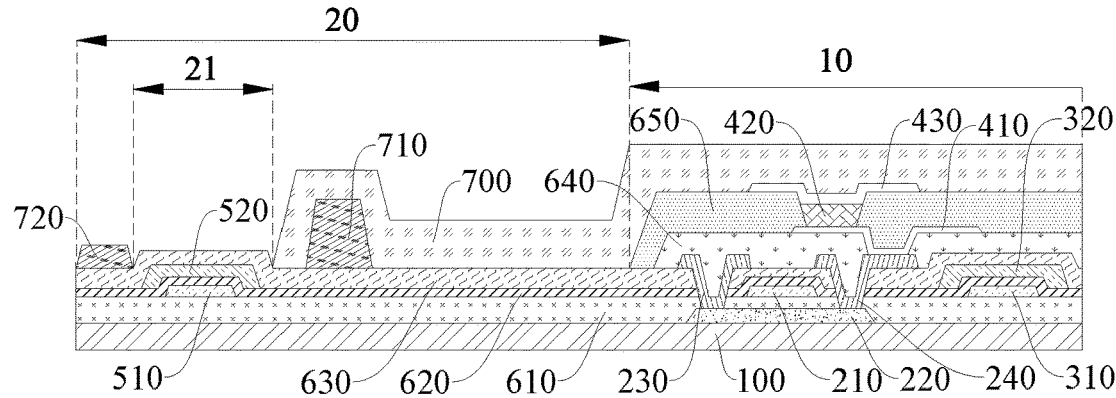
FIG. 6 shows a schematic diagram of a sectional structure of a display panel according to an embodiment of the present application.

According to an embodiment of the present application, further, referring to FIG. 6, it may be understood that the display panel may further include an encapsulation structure 700 disposed on a surface of a light emitting element in the display backplane away from the base substrate 100. An orthographic projection of the encapsulation structure 700 on the base substrate 100 covers a display region 10 and a portion of a non-display region 20. A peripheral edge of the encapsulation structure 700 is provided with a first retaining wall 710, and a second retaining wall 720 is disposed around a peripheral edge of the non-display region 20. A fingerprint identification region 21 in the display backplane is located between the first retaining wall 710 and the second retaining wall 720 (referring to FIG. 6 and FIG. 7 for a structural schematic diagram) or between the first retaining wall 710 and the display region 10 (referring to FIG. 8 for a structural schematic diagram). Therefore, a structure of the display panel is simple and easy to achieve, the fingerprint identification region does not occupy space of the display region, and it is easy to achieve a narrow bezel.

According to an embodiment of the present application, it may be understood that a function of the first retaining wall 710 is not particularly limited, for example, in some embodiments of the present application, the first retaining wall 710 may be a retaining wall for preventing water and oxygen from invading when the display panel is an organic electroluminescent display panel. In some embodiments, the first retaining wall may include at least one organic layer, for example, may be at least one of a planarization layer 640, a pixel definition layer 650, and a passivation layer.

According to an embodiment of the present application, it may be understood that a function of the second retaining wall 720 is also not particularly limited. For example, in some embodiments of the present application, the second retaining wall 720 may be a retaining wall that prevents a crack from being generated from an edge of a cutting line to an inside of the display panel when the display panel is cut in a fabrication process of the display panel. A specific structure of the second retaining wall 720 is not particularly limited, for example, it may be a structure formed by punching a hole in an inorganic layer and filling an organic material, and it specifically may be a conventional structure of a retaining wall that plays the above role in the related art and will not be repeated herein.

Figure 7:
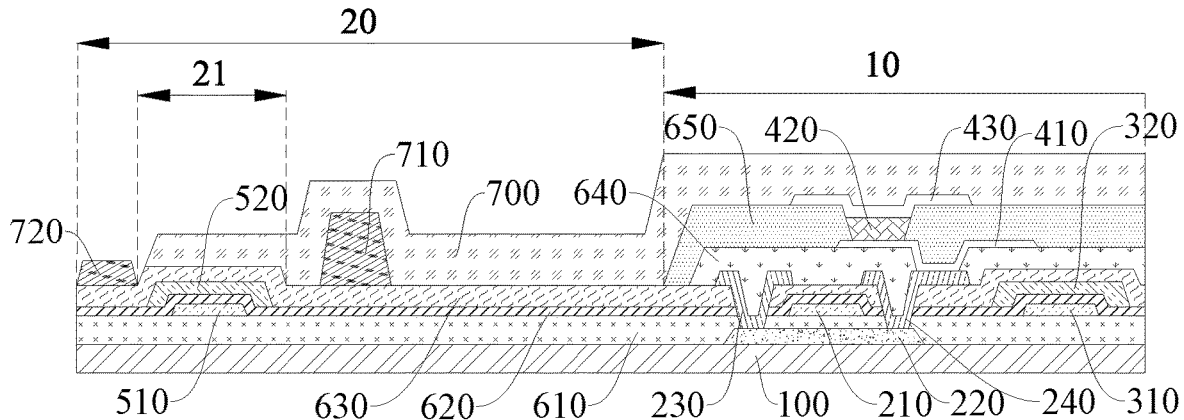
FIG. 7 shows a schematic diagram of a sectional structure of a display panel according to an embodiment of the present application.
Figure 8:
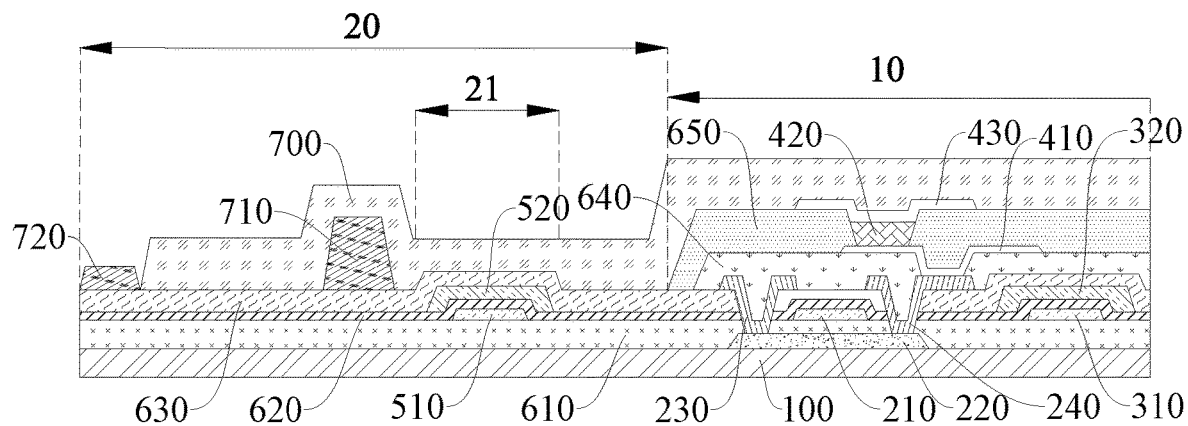
FIG. 8 shows a schematic diagram of a sectional structure of a display panel according to an embodiment of the present application.

According to an embodiment of the present application, further, referring to FIG. 7, when the fingerprint identification region 21 is located between the first retaining wall 710 and the second retaining wall 720, the orthographic projection of the encapsulation structure 700 on the base substrate 100 may also cover the fingerprint identification region 21. Therefore, through the above arrangement mode, a fingerprint identification effect may be better, and service life of the fingerprint identification sensor may be longer.

Figure 9:
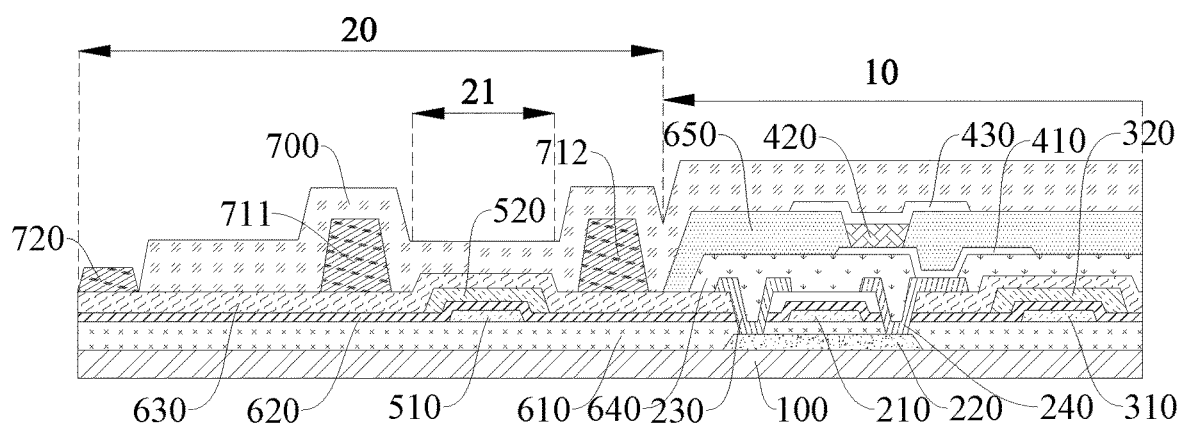
FIG. 9 shows a schematic diagram of a sectional structure of a display panel according to an embodiment of the present application.

According to an embodiment of the present application, further, the first retaining wall may further include at least two sub-retaining walls, for example, referring to FIG. 9, the first retaining wall includes a first sub-retaining wall 711 and a second sub-retaining wall 712, and the fingerprint identification region 21 may also be located between two adjacent sub-retaining walls. Therefore, through the above arrangement mode, the fingerprint identification effect may be better, and the service life of the fingerprint identification sensor is longer. In addition, due to arrangement of the fingerprint identification region 21, a water and oxygen intrusion path between the first sub-retaining wall 711 and the second sub-retaining wall 712 is further longer, and an encapsulation effect is better.

According to an embodiment of the present application, it may be understood that the first retaining wall described above is not limited to only including two sub-retaining walls, and may also include more sub-retaining walls. When a quantity of sub-retaining walls disposed is larger, the encapsulation effect is better. When a plurality of sub-retaining walls are disposed, it may be understood that the fingerprint identification region 21 may also be disposed between any two of the sub-retaining walls, which will not be repeated herein.

According to an embodiment of the present application, the display panel may include another necessary structure and composition besides the display backplane and the encapsulation structure described above, and those skilled in the art may supplement and design according to a specific type and use requirements of the display panel, which will not be repeated herein.

In yet another aspect of the present application, the present application provides a display apparatus. According to an embodiment of the present application, the display apparatus includes the display panel described above. The display apparatus has a simple structure, is easy to achieve, capable of achieving fingerprint identification, a fingerprint identification region will not occupy space of a display region, it is easy to achieve a narrow bezel, and the display apparatus has all features and advantages of the display panel described above, which will not be repeated herein.

According to an embodiment of the present application, the display apparatus may include another necessary structure and composition besides the display panel described above, and those skilled in the art may supplement and design according to a specific type and use requirements of the display apparatus, which will not be repeated herein.

According to an embodiment of the present application, a specific type of the display apparatus is not particularly limited, for example, it includes, but is not limited to, a mobile phone, a tablet computer, a wearable device, a game machine, a television, or a vehicle-mounted display, etc.

In the description of the present application, it may be understood that terms "first" and "second" are used for a purpose of description only, and cannot be understood as indicating or implying relative importance or implicitly indicating a quantity of indicated technical features. Therefore, features defined with "first" and "second" may explicitly or implicitly include one or more these features. In the description of the present application, "plurality" means two or more than two, unless otherwise specifically defined.

In the description of the specification, description referring to terms "an embodiment", "some embodiments", "an example", "a specific example", or "some examples", etc. means that a specific feature, a structure, a material, or characteristics described in connection with this embodiment or example is included in at least one embodiment or example of the present application. In the specification, schematic expressions of the above terms are not necessarily aimed at a same embodiment or example. Moreover, a specific feature, a structure, a material, or characteristics described may be combined in any one or more embodiments or examples in a suitable manner. In addition, those skilled in the art may combine different embodiments or examples described in the specification and features of different embodiments or examples without conflict.

Although embodiments of the present application have been shown and described above, it may be understood that the above embodiments are exemplary, and will not be understood as limitations on the present application. Changes, modifications, substitutions, and variations may be made to the above-mentioned embodiments by those skilled in the art within the scope of the present application.

The invention claimed is:

1. A display backplane, wherein the display backplane is divided into a display region and a non-display region disposed around the display region, and the non-display region comprises a fingerprint identification region, the display backplane comprises:
    a base substrate;
    a thin film transistor array layer, wherein the thin film transistor array layer is disposed on a side of the base substrate, and the thin film transistor array layer comprises a gate, an active layer, a source, and a drain;
    a capacitive electrode layer, wherein the capacitive electrode layer comprises a first electrode layer and a second electrode layer, and the second electrode layer is disposed on a side of the first electrode layer away from the base substrate;
    a light emitting element, wherein the light emitting element is disposed on a side of the thin film transistor array layer away from the base substrate; and
    a fingerprint identification sensor, wherein the fingerprint identification sensor is located in the fingerprint identification region, and a drive electrode and a sensing electrode in the fingerprint identification sensor are disposed in a same layer as the first electrode layer and the second electrode layer, respectively, wherein one of the drive electrode and the sensing electrode is arranged along a first direction, and the other of the drive electrode and the sensing electrode is arranged along a second direction intersecting with the first direction, the drive electrode and the sensing electrode have an overlapping region, and the drive electrode and the sensing electrode located in the overlapping region are configured into a plurality of sensing pixel units disposed at intervals with each other, and a capacitor may be formed in a sensing pixel unit.

2. The display backplane according to claim 1, wherein the first electrode layer is disposed in a same layer as the gate.

3. The display backplane according to claim 1, wherein the second electrode layer is between the source, the drain, and the first electrode layer.

4. The display backplane according to claim 1, wherein the drive electrode is disposed in a same layer as the first electrode layer, the sensing electrode is disposed in a same layer as the second electrode layer, or, the drive electrode is disposed in a same layer as the second electrode layer, and the sensing electrode is disposed in a same layer as the first electrode layer.

5. The display backplane according to claim 1, wherein the display backplane further comprises a fingerprint identification chip and the sensing electrode is electrically connected with the fingerprint identification chip.

6. The display backplane according to claim 5, wherein the sensing electrode is electrically connected with the fingerprint identification chip through a metal lead.

7. A display panel, wherein the display panel comprises the display backplane according to claim 1.

8. The display panel according to claim 7, wherein the display panel further comprises an encapsulation structure disposed on a surface of the light emitting element in the display backplane away from the base substrate, an orthographic projection of the encapsulation structure on the base substrate covers the display region and a portion of the non-display region, a first retaining wall is disposed on a peripheral edge of the encapsulation structure, and a second retaining wall is disposed around a peripheral edge of the non-display region, and the fingerprint identification region in the display backplane is located between the first retaining wall and the second retaining wall or between the first retaining wall and the display region.

9. The display panel according to claim 8, wherein the fingerprint identification region is located between the first retaining wall and the second retaining wall, and the orthographic projection of the encapsulation structure on the base substrate covers the fingerprint identification region.

10. The display panel according to claim 8, wherein the first retaining wall further comprises at least two sub-retaining walls and the fingerprint identification region is located between two adjacent sub-retaining walls.

11. A display apparatus, wherein the display apparatus comprises the display panel according to claim 7.

12. The display backplane according to claim 2, wherein the second electrode layer is between the source, the drain, and the first electrode layer.

13. The display backplane according to claim 2, wherein the drive electrode is disposed in a same layer as the first electrode layer, the sensing electrode is disposed in a same layer as the second electrode layer, or, the drive electrode is disposed in a same layer as the second electrode layer, and the sensing electrode is disposed in a same layer as the first electrode layer.

14. The display backplane according to claim 2, wherein the display backplane further comprises a fingerprint identification chip and the sensing electrode is electrically connected with the fingerprint identification chip.

15. A display panel, wherein the display panel comprises the display backplane according to claim 2.

16. The display backplane according to claim 3, wherein the display backplane further comprises a fingerprint identification chip and the sensing electrode is electrically connected with the fingerprint identification chip.

17. A fabrication method for a display backplane, wherein the display backplane is divided into a display region and a non-display region disposed around the display region, and the non-display region comprises a fingerprint identification region, the display backplane comprises:
a base substrate;
a thin film transistor array layer, wherein the thin film transistor array layer is disposed on a side of the base substrate, and the thin film transistor array layer comprises a gate, an active layer, a source, and a drain;
a capacitive electrode layer, wherein the capacitive electrode layer comprises a first electrode layer and a second electrode layer, and the second electrode layer is disposed on a side of the first electrode layer away from the base substrate;
a light emitting element, wherein the light emitting element is disposed on a side of the thin film transistor array layer away from the base substrate; and
a fingerprint identification sensor, wherein the fingerprint identification sensor is located in the fingerprint identification region, and a drive electrode and a sensing electrode in the fingerprint identification sensor are disposed in a same layer as the first electrode layer and the second electrode layer, respectively, wherein one of the drive electrode and the sensing electrode is arranged along a first direction, and the other of the drive electrode and the sensing electrode is arranged along a second direction intersecting with the first direction, the drive electrode and the sensing electrode have an overlapping region, and the drive electrode and the sensing electrode located in the overlapping region are configured into a plurality of sensing pixel units disposed at intervals with each other, and a capacitor may be formed in a sensing pixel unit, and wherein the method comprises:
forming the thin film transistor array layer, the capacitive electrode layer, the light emitting element, and the fingerprint identification sensor on the side of the base substrate, wherein the thin film transistor array layer comprises the gate, the active layer, the source, and the drain, the capacitive electrode layer comprises the first electrode layer and the second electrode layer, the drive electrode and the sensing electrode in the fingerprint identification sensor are respectively formed with the first electrode layer and the second electrode layer through one patterning process.

18. The method according to claim 17, wherein the drive electrode and the first electrode layer are formed through one patterning process, and the sensing electrode and the second electrode layer are formed through one patterning process; or, the drive electrode and the second electrode layer are formed through one patterning process, and the sensing electrode and the first electrode layer are formed through one patterning process.

19. The method according to claim 17, wherein the method further comprises:
   forming the active layer on a side of the base substrate;
   forming a first gate insulation layer on a side of the active layer away from the base substrate;
   forming one of the drive electrode and the sensing electrode, the gate, and the first electrode layer on a side of the first gate insulation layer away from the base substrate;
   forming a second gate insulation layer a side of the one of the drive electrode and the sensing electrode, the gate, and the first electrode layer away from the base substrate;
   forming the other of the drive electrode and the sensing electrode, and the second electrode layer on a side of the second gate insulation layer away from the base substrate;
   forming an interlayer dielectric layer on a side of the other of the drive electrode and the sensing electrode, and the second electrode layer away from the base substrate;
   forming the source and the drain; and
   forming the light emitting element on a side of the interlayer dielectric layer away from the base substrate to obtain the display backplane.

20. A display panel, wherein the display panel comprises a display backplane, wherein the display backplane is divided into a display region and a non-display region disposed around the display region, and the non-display region comprises a fingerprint identification region, the display backplane comprises:
   a base substrate;
   a thin film transistor array layer, wherein the thin film transistor array layer is disposed on a side of the base substrate, and the thin film transistor array layer comprises a gate, an active layer, a source, and a drain;
   a capacitive electrode layer, wherein the capacitive electrode layer comprises a first electrode layer and a second electrode layer, and the second electrode layer is disposed on a side of the first electrode layer away from the base substrate;
   a light emitting element, wherein the light emitting element is disposed on a side of the thin film transistor array layer away from the base substrate; and
   a fingerprint identification sensor, wherein the fingerprint identification sensor is located in the fingerprint identification region, and a drive electrode and a sensing electrode in the fingerprint identification sensor are disposed in a same layer as the first electrode layer and the second electrode layer, respectively,
   wherein the display panel further comprises an encapsulation structure disposed on a surface of the light emitting element in the display backplane away from the base substrate, an orthographic projection of the encapsulation structure on the base substrate covers the display region and a portion of the non-display region, a first retaining wall is disposed on a peripheral edge of the encapsulation structure, and a second retaining wall is disposed around a peripheral edge of the non-display region, and the fingerprint identification region in the display backplane is located between the first retaining wall and the second retaining wall or between the first retaining wall and the display region.

* * * * *